United States Patent
Wang et al.

(10) Patent No.: US 10,847,731 B2
(45) Date of Patent: Nov. 24, 2020

(54) ORGANIC LIGHT EMITTING DIODE DEVICE AND MANUFACTURING METHOD THEREOF

(71) Applicant: Wuhan China Star Optoelectronics Semiconductor Display Technology Co., Ltd., Wuhan (CN)

(72) Inventors: Hai Wang, Wuhan (CN); Weinan Yan, Wuhan (CN); Kunyueh Tsai, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/318,135

(22) PCT Filed: Sep. 11, 2018

(86) PCT No.: PCT/CN2018/104970
§ 371 (c)(1),
(2) Date: Jan. 16, 2019

(87) PCT Pub. No.: WO2020/029363
PCT Pub. Date: Feb. 13, 2020

(65) Prior Publication Data
US 2020/0106029 A1 Apr. 2, 2020

(30) Foreign Application Priority Data
Aug. 10, 2018 (CN) .......................... 2018 1 0907178

(51) Int. Cl.
*H01L 51/00* (2006.01)
*G06F 3/041* (2006.01)
(Continued)

(52) U.S. Cl.
CPC ........ *H01L 51/0097* (2013.01); *G06F 3/0412* (2013.01); *H01L 27/323* (2013.01);
(Continued)

(58) Field of Classification Search
CPC . H01L 51/0097; H01L 51/0031; H01L 51/56; H01L 27/323; H01L 27/3262;
(Continued)

(56) References Cited

U.S. PATENT DOCUMENTS

2018/0102402 A1* 4/2018 Hwang ................ G09G 3/3233

FOREIGN PATENT DOCUMENTS

| CN | 106384740 | 2/2017 |
| CN | 106847864 | 6/2017 |
| CN | 105789225 | 7/2019 |

* cited by examiner

*Primary Examiner* — Jasmine J Clark

(57) ABSTRACT

Provided is an OLED device and a manufacturing method thereof. The OLED device includes: a flexible substrate having signal electrodes embedded on a surface of one side of the flexible substrate and a thin film transistor layer and a pixel unit layer prepared on a surface of the other side; both a first driving chip and a flexible circuit board are disposed on a back surface of the flexible substrate; signal traces in the thin film transistor layer and the pixel unit layer are connected to corresponding signal electrodes through vias, and the signal electrodes are connected to the first driving chip.

10 Claims, 2 Drawing Sheets

(51) Int. Cl.
*H01L 27/32* (2006.01)
*H01L 51/52* (2006.01)
*H01L 51/56* (2006.01)

(52) U.S. Cl.
CPC ........ *H01L 27/3276* (2013.01); *H01L 51/003* (2013.01); *H01L 51/0031* (2013.01); *H01L 51/5253* (2013.01); *H01L 51/5281* (2013.01); *H01L 51/56* (2013.01); *G06F 2203/04102* (2013.01); *G06F 2203/04103* (2013.01); *H01L 2227/326* (2013.01); *H01L 2251/5338* (2013.01)

(58) Field of Classification Search
CPC . H01L 51/441; H01L 27/3244; H01L 51/003; H01L 51/5253; H01L 51/5281; H01L 2227/326; H01L 2227/323; G06F 2203/04102; G06F 2203/04103; G06F 3/0412; Y02E 10/549
See application file for complete search history.

ORGANIC LIGHT EMITTING DIODE DEVICE AND MANUFACTURING METHOD THEREOF

RELATED APPLICATIONS

This application is a National Phase of PCT Patent Application No. PCT/CN2018/104970 having International filing date of Sep. 11, 2018, which claims the benefit of priority of Chinese Patent Application No. 201810907178.2 filed on Aug. 10, 2018. The contents of the above applications are all incorporated by reference as if fully set forth herein in their entirety.

FIELD AND BACKGROUND OF THE INVENTION

The present disclosure relates to a display field, and more particularly to an organic light emitting diode device and a manufacturing method thereof.

With the releases of full screen phones, such as Samsung S8/Note 8 and iPhone X, the full screen technology is now the trend. The full screen means that a front of a mobile phone is all used to display effective information. The surrounding of the mobile phone is designed without borders for pursuing a screen ratio close to 100%. Thus, a display area of the mobile phone is greatly improved. The beauty of technology is deeply loved by many consumers. However, due to the problems of the existing panel design and manufacturing process, such as positions of a headphone, a front camera, a fingerprint recognition, an iris recognition element, etc., will occupy a part of the display area, so the current full screen product may consumes about 90%. The existing full screen technology implementation scheme generally utilizes COF (Chip On Film)/COP (Chip On PI) skill under the panel. Driving integrated circuit (DIC) is bonded to a film or a PI, and then is bent to a rear part of the panel. Due to the problem of minimum bending radius of the PI or film material, it will inevitably leave some borders in a bending area and affect the actual display area. Moreover, the presence of the bending area does not only increase the mechanical unreliability but also requires some special design for high-speed signal transmission.

Therefore, there is a need to provide an organic light emitting diode device and a manufacturing method thereof to solve the existing problems of the prior art.

SUMMARY OF THE INVENTION

The present disclosure provides an organic light emitting diode (OLED) device and a manufacturing method thereof, which can solve a black border caused by COF/COP, and increase an effective display area of the display panel, and enhance the mechanical strength of the DIC/touch integrated circuit (TIC).

To solve the aforesaid problem, the technical solution provided by the present disclosure is described as follows:

the present disclosure provides a manufacturing method of an organic light emitting diode device, including a display panel, where the manufacturing method includes steps of:

Step S1, cleaning a glass substrate, and preparing a metal film on the glass substrate, and etching the metal film to form signal electrodes spaced apart, where the signal electrodes include a first type signal electrode and a second type signal electrode;

Step S2, sequentially preparing a flexible substrate and a thin film transistor layer on the glass substrate, where a signal trace of the thin film transistor layer is connected to the first type signal electrode through a first type via;

Step S3, preparing a pixel unit layer on the thin film transistor layer, where a signal trace of the pixel unit layer is connected to the second type signal electrode through a second type via;

Step S4, stripping the glass substrate, and bonding a first driving chip to a stripped surface of the flexible substrate, where both the first type signal electrode and the second type signal electrode are electrically connected to the first driving chip; and Step S5, preparing a flexible circuit board on one surface of the flexible substrate close to the signal electrodes, and bonding the flexible circuit board to the first driving chip.

According to one preferred embodiment of the disclosure, the first type via includes a source via, a drain via and a gate via; the first type signal electrode includes:

a source signal electrode, connected to a source of the thin film transistor layer through the source via for receiving a source signal;

a drain signal electrode, connected to a drain of the thin film transistor layer through the drain via for receiving a drain signal;

a gate signal electrode, connected to a gate of the thin film transistor layer through the gate via for receiving a gate signal;

the second type via includes an anode via, and the second type signal electrode includes an anode signal electrode, and the anode signal electrode is connected to an anode layer of the pixel unit layer through the anode via for receiving an anode signal.

According to one preferred embodiment of the disclosure, the organic light emitting diode device further includes a touch screen, and the signal electrodes further include a third type signal electrode, and after Step S3, the manufacturing method further includes a step of:

Step S31, preparing a touch layer on the pixel unit layer, and a signal trace of the touch layer is connected to the third type signal electrode through a third type via;

the third type via includes a driving electrode via and a sensing electrode via, and the third type signal electrode includes: a driving signal electrode, connected to the driving electrode of the touch layer through the driving electrode via for receiving a driving electrode signal; and a sensing signal electrode, connected to the sensing electrode of the touch layer through the sensing electrode via for receiving a sensing electrode signal.

According to one preferred embodiment of the disclosure, after Step S4, the manufacturing method further includes a step of:

Step S41, bonding a second driving chip to the stripped surface of the flexible substrate, and spacing the second driving chip from the first driving chip and setting the second driving chip in a same layer with the first driving chip, where the driving signal electrode and the sensing signal electrode are electrically connected to the second driving chip, respectively;

after Step S5, the manufacturing method further includes a step of:

Step S51, connecting the second driving chip to the flexible circuit board, such that the flexible circuit board is located at a rear portion of the display panel of the organic light emitting diode device.

According to one preferred embodiment of the disclosure, the manufacturing method further includes a step of:

Step S6, performing a lighting test on the organic light emitting diode device;

Step S7, preparing a thin film encapsulation layer on a surface of the touch layer after the organic light emitting diode device is normally displaying;

Step S8, inverting the organic light emitting diode device, and coating a surface of the flexible substrate with a high-viscosity opaque protective adhesive for planarization, where the protective adhesive covers the first driving chip, the second driving chip and a portion of the flexible circuit board; and Step S9, sequentially attaching a polarizer and a protective cover to one side of the thin film encapsulation layer of the organic light emitting diode device.

The present disclosure further provides an organic light emitting diode device, including:

a flexible substrate;

a thin film transistor layer, disposed on the flexible substrate;

a pixel unit layer, disposed on the thin film transistor layer; and signal electrodes, embedded in a surface of one side of the flexible substrate away from the pixel unit layer, where the signal electrodes include a first type signal electrode and a second type signal electrode;

a first driving chip, disposed on the surface of the one side of the flexible substrate away from the pixel unit layer;

a flexible circuit board, disposed on the one side of the flexible substrate away from the pixel unit layer, and bonded to the first driving chip;

where a signal trace of the thin film transistor layer is connected to the first type signal electrode through a first type via, and a signal trace of the pixel unit layer is connected to the second type signal electrode through a second type via, and both the first type signal electrode and the second type signal electrode are electrically connected to the first driving chip.

According to one preferred embodiment of the disclosure, the first type via includes a source via, a drain via and a gate via; the first type signal electrode includes:

a source signal electrode, connected to a source of the thin film transistor layer through the source via for receiving a source signal;

a drain signal electrode, connected to a drain of the thin film transistor layer through the drain via for receiving a drain signal;

a gate signal electrode, connected to a gate of the thin film transistor layer through the gate via for receiving a gate signal;

the second type via includes an anode via, and the second type signal electrode includes an anode signal electrode, and the anode signal electrode is connected to an anode layer of the pixel unit layer through the anode via for receiving an anode signal.

According to one preferred embodiment of the disclosure, the organic light emitting diode device further includes:

a touch layer, disposed on the pixel unit layer; and a second driving chip, disposed on the surface of the one side of the flexible substrate away from the pixel unit layer, and spaced from the first driving chip and set in a same layer with the first driving chip, and sharing the flexible circuit board with the first driving chip;

the signal electrodes further include a third type signal electrode, and a signal trace of the touch layer is connected to the third type signal electrode through a third type via, and the third type signal electrode is electrically connected to the second driving chip;

the third type via includes a driving electrode via and a sensing electrode via, and the third type signal electrode includes: a driving signal electrode, connected to the driving electrode of the touch layer through the driving electrode via for receiving a driving electrode signal; and a sensing signal electrode, connected to the sensing electrode of the touch layer through the sensing electrode via for receiving a sensing electrode signal.

According to one preferred embodiment of the disclosure, surfaces of the first driving chip, the second driving chip and a portion of the flexible circuit board are formed with a high-viscosity opaque protective adhesive.

According to one preferred embodiment of the disclosure, the organic light emitting diode device further includes:

a thin film encapsulation layer, disposed on the touch layer;

a polarizer, disposed on the thin film encapsulation layer; and a protective cover, disposed on the polarizer.

The benefits of the present disclosure are: compared to existing OLED devices, the OLED device and the manufacturing method thereof of the present disclosure introduce signals of the thin film transistor layer, the pixel unit layer and the touch layer onto an independent signal layer by using a via method, and after bonding the first driving chip (DIC), the flexible circuit board (FPC) can be directly disposed under the display panel without bending to eliminate a black border caused by COF/COP and effectively increase the display area. Meanwhile, by adding a protective buffer layer under the first driving chip and the second driving chip (TIC), the FPC of the first driving chip and the second driving chip is integrated, thereby increasing the integration degree of the display panel; the first driving chip/second driving chip is protected by the high-viscosity opaque adhesive, which can reduce the fragility and enhance the mechanical strength; since pins of the first driving chip/the second driving chip are protected by a high viscosity opaque adhesive, it is difficult to analyze optical, electrical and other properties by conventional means, such as a light mirror, an oscilloscope, a multimeter, etc., and enhance the data confidentiality thereof.

BRIEF DESCRIPTION OF THE SEVERAL VIEWS OF THE DRAWINGS

In order to more clearly illustrate the embodiments of the present disclosure and the prior art, the following figures will be described in the embodiments and the prior art are briefly introduced. It is obvious that the drawings are only some embodiments of the present disclosure, those of ordinary skill in this field can obtain other figures according to these figures without paying the premise.

DESCRIPTION OF SPECIFIC EMBODIMENTS OF THE INVENTION

Figure 1:
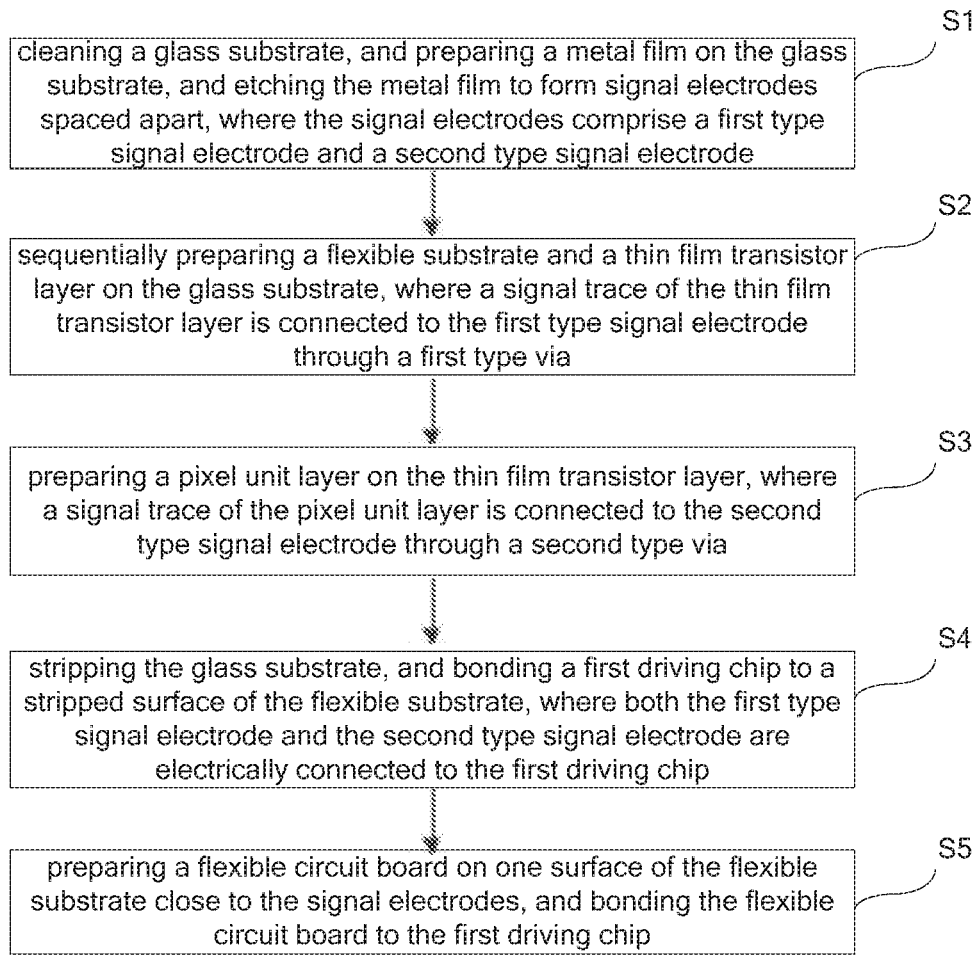
FIG. 1 is a flow chart of a manufacturing method of an OLED device provided by the embodiment of the present disclosure.

The following descriptions for the respective embodiments are specific embodiments capable of being implemented for illustrations of the present disclosure with referring to appended figures. The terms of up, down, front, rear, left, right, interior, exterior, side, etcetera are merely directions of referring to appended figures. Thus, the used directional terms are used to describe and understand the present disclosure, but the present disclosure is not limited thereto. In the figure, units with similar structures are denoted by the same reference numerals.

The OLED device of the prior art is influenced by the bending property of the COF/COP material, and leaves a black border on the bonding area of the display panel, thereby affecting the actual display area of the display panel. Meanwhile, the presence of the bonding area also increases the technical problems of mechanical unreliability. This embodiment can solve the defects.

Figure 2A:
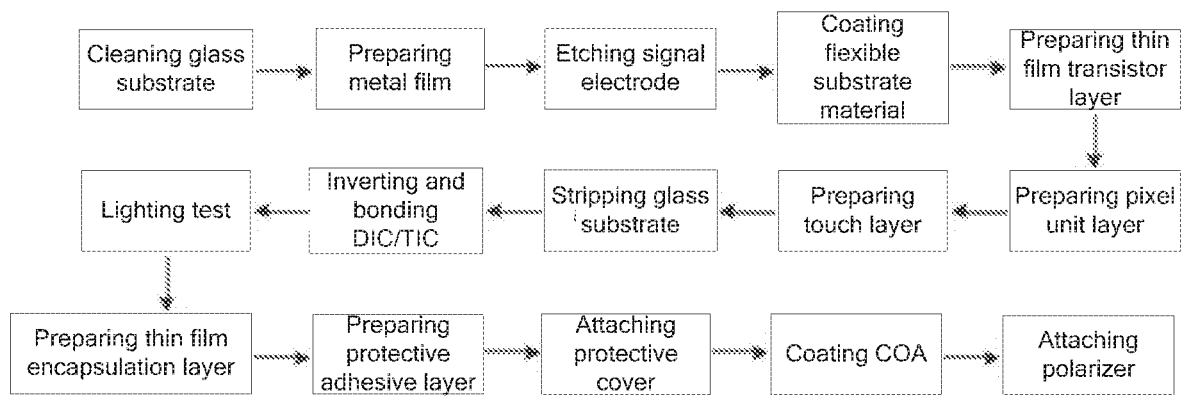
FIG. 2a is a flow chart of a manufacturing method of an OLED device provided by the embodiment of the present disclosure.

As shown in FIG. 1, a flow chart of a manufacturing method of an OLED device provided by the embodiment of the present disclosure, the organic light emitting diode (OLED) device, includes a display panel, and the manufacturing method includes steps of:

Step S1, cleaning a glass substrate, and preparing a metal film on the glass substrate, and etching the metal film to form signal electrodes spaced apart, where the signal electrodes include a first type signal electrode and a second type signal electrode; specifically, referring to FIG. 2*a*, which is a flow chart of a manufacturing method of an OLED device according to an embodiment of the present disclosure. The glass substrate is first cleaned, and then the metal film is prepared on the surface of the glass substrate, and then the metal film is etched to form the signal electrodes spaced apart.

Step S2, sequentially preparing a flexible substrate and a thin film transistor layer on the glass substrate, where a signal trace of the thin film transistor layer is connected to the first type signal electrode through a first type via;

specifically, PI (flexible substrate material) is coated, the flexible material is coated on the glass substrate to form the flexible substrate and to cover the signal electrodes. Then, the thin film transistor layer is prepared on the flexible substrate. The thin film transistor layer includes: an active layer, an interlayer insulating layer, a gate, a gate insulating layer, a source, a drain and a planarization layer; the first type via is formed in the preparation of the thin film transistor layer, and the first type via includes a source via corresponding to the source, a drain via corresponding to the drain and a gate via corresponding to the gate, and the aforesaid vias penetrate the flexible substrate for connecting the corresponding signal electrodes. The first type signal electrode includes: a source signal electrode, connected to the source through the source via for receiving a source signal; a drain signal electrode, connected to the drain through the drain via for receiving a drain signal; a gate signal electrode, connected to the gate through the gate via for receiving a gate signal.

Step S3, preparing a pixel unit layer on the thin film transistor layer, where a signal trace of the pixel unit layer is connected to the second type signal electrode through a second type via;

specifically, the pixel unit layer is prepared on the thin film transistor layer, and the pixel unit layer includes an anode layer, an organic light-emitting layer and a cathode layer, and the pixel unit layer includes a plurality of sub pixels, and in the preparation of the pixel unit layer, the second type via is formed in the pixel unit layer and the thin film transistor layer, and the second type via includes an anode via, and the second type signal electrode includes an anode signal electrode, and the anode signal electrode is connected to an anode layer through the anode via, and the anode signal electrode is used for receiving an anode signal.

The OLED device further includes a touch screen, and the signal electrodes further include a third type signal electrode, and after Step S3, the manufacturing method further includes a step of:

Step S31, preparing a touch layer on the pixel unit layer, and a signal trace of the touch layer is connected to the third type signal electrode through a third type via;

the third type via includes a driving electrode via and a sensing electrode via, and the third type signal electrode includes: a driving signal electrode, connected to the driving electrode of the touch layer through the driving electrode via for receiving a driving electrode signal; and a sensing signal electrode, connected to the sensing electrode of the touch layer through the sensing electrode via for receiving a sensing electrode signal.

The drive electrode is driven at a particular frequency voltage, the sensing electrode is scanned at a particular frequency. The third type via starts to penetrate the pixel unit layer, the thin film transistor layer and the flexible substrate from the touch layer, and reaches to the third type signal electrode.

Step S4, stripping the glass substrate, and bonding a first driving chip to a stripped surface of the flexible substrate, where both the first type signal electrode and the second type signal electrode are electrically connected to the first driving chip; and after Step S4, the manufacturing method further includes a step of:

Step S41, bonding a second driving chip to the stripped surface of the flexible substrate, and spacing the second driving chip from the first driving chip and setting the second driving chip in a same layer with the first driving chip, where the driving signal electrode and the sensing signal electrode are electrically connected to the second driving chip, respectively;

specifically, the glass substrate is stripped, and after being inverted, a first driving chip and a second driving chip are bonded to a stripped surface of the flexible substrate, and the first type signal electrode, the second type signal electrode, the gate signal electrode and the anode signal electrode are all electrically connected to the first driving chip. The second driving chip is bonded in the same layer with the first driving chip, and spaced apart therefrom.

Step S5, preparing a flexible circuit board on one surface of the flexible substrate close to the signal electrodes, and bonding the flexible circuit board to the first driving chip.

after Step S5, the manufacturing method further includes a step of:

Step S51, bonding the second driving chip to the flexible circuit board, such that the flexible circuit board is located at a rear portion of the display panel of the organic light emitting diode device.

Specifically, a flexible circuit board is prepared on one surface of the flexible substrate close to the signal electrodes. The first driving chip and the second driving chip are both connected to the flexible circuit board, such that the flexible circuit board is located at a rear portion of the display panel of the OLED device.

The manufacturing method of the OLED device further includes steps of:

Step S6, performing a lighting test on the organic light emitting diode device;

Step S7, preparing a thin film encapsulation layer on a surface of the touch layer after the organic light emitting diode device is normally displaying;

Step S8, inverting the organic light emitting diode device, and coating a surface of the flexible substrate with a high-viscosity opaque protective adhesive for planarization, where the protective adhesive covers the first driving chip, the second driving chip and a portion of the flexible circuit board; and Step S9, sequentially attaching a polarizer and a protective cover to one side of the thin film encapsulation layer of the organic light emitting diode device.

Figure 2B:
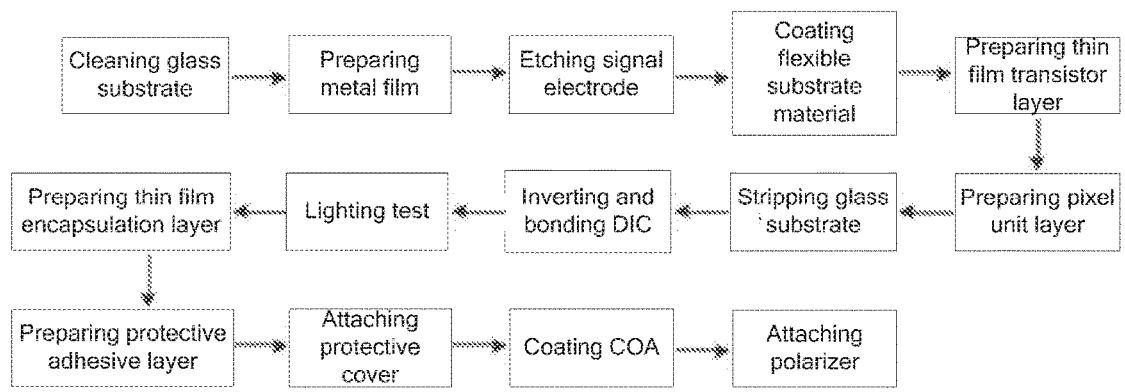
FIG. 2b is a flow chart of a manufacturing method of another OLED device provided by the embodiment of the present disclosure.

Please refer to FIG. 2b, which shows a flow chart of a manufacturing method of another OLED device provided by the embodiment of the present disclosure. The difference between this embodiment and the first embodiment is: the step of stripping the glass substrate is implemented after preparing the pixel unit layer. Then, the first driving chip is bonded on the surface of the flexible substrate, and the first type signal electrodes corresponding to the source, the drain and the gate and the second type signal electrode corresponding to the anode layer are all connected to the first driving chip. Thereafter, the flexible circuit board is prepared on one surface of the flexible substrate close to the signal electrodes. The first driving chip is connected to the flexible circuit board, such that the flexible circuit board is located at a rear portion of the display panel of the OLED device. Then, the lighting test is performed. After normally displaying, the thin film encapsulation layer is prepared on the surface of the touch layer; then, the OLED device is inverted and the protective adhesive is dropped for planarization to protect the pins of the first driving chip; and then, the OLED device is inverted to be attached with the polarizer, and a layer of optically clear adhesive (OCA) is coated on the polarizer and the protective cover is attached. The steps before preparing the pixel unit layer are the same as those of the first embodiment, and the repeated explanation is omitted here.

Figure 3:
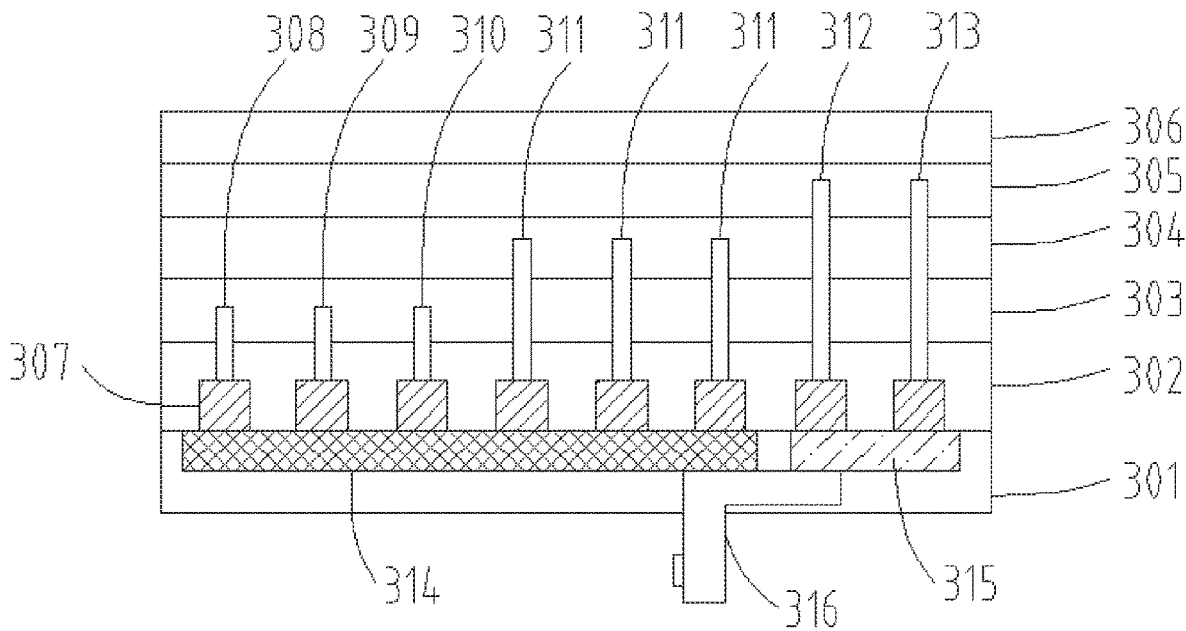
FIG. 3 is a sectional diagram of an OLED device provided by the embodiment of the present disclosure.

The present disclosure further provides an OLED device, as shown in FIG. 3, which is a sectional diagram of the OLED device provided by the embodiment of the present disclosure. The OLED device includes: a flexible substrate 302, a thin film transistor layer 303, disposed on the flexible substrate 302; where the thin film transistor layer 303 includes a source, a drain and a gate (not shown in figures); a pixel unit layer 304, disposed on the thin film transistor layer 303; where the pixel unit layer 304 includes an anode layer, an organic light-emitting layer and a cathode layer (not shown in figures); a touch layer 305, disposed on the pixel unit layer 304, where touch layer 305 includes a driving electrode and a sensing electrode (not shown in figures); a thin film encapsulation layer 306, disposed on the touch layer 305; signal electrodes 307, embedded on a surface of one side (rear portion) of the flexible substrate 302 away from the pixel unit layer 304, where the signal electrodes 307 are evenly distributed on the surface of the rear portion of the flexible substrate 302; a first driving chip 314, disposed on the rear portion of the flexible substrate 302 and electrically connected to the signal electrodes 307; a second driving chip 315, set in a same layer with the first driving chip 314 and spaced therefrom on the rear portion of the flexible substrate 302, and electrically connected to the signal electrodes 307; a flexible substrate 316, disposed on the rear portion of the flexible substrate 302, where the first driving chip 314 and the second driving chip 315 are both connected to the flexible circuit board 316.

The surface of the one side of the flexible substrate 302 bonded with the first driving chip 314 and the second driving chip 315 is coated with a layer of high viscosity opaque protective adhesive 301. The protective adhesive 301 covers the first driving chip 314, the second driving chip 315 and a portion of the flexible circuit board 316. The OLED device further includes: a polarizer, disposed on the thin film encapsulation layer 306; and a protective cover, disposed on the polarizer.

The signal electrodes 307 include a first type signal electrode, a second type signal electrode and a third type signal electrode; a signal trace of the thin film transistor layer 303 is connected to the first type signal electrode through a first type via, and a signal trace of the pixel unit layer 304 is connected to the second type signal electrode through a second type via, and a signal trace of the touch layer 305 is connected to the third type signal electrode through a third type via; and both the first type signal electrode and the second type signal electrode are electrically connected to the first driving chip 314; the third type signal electrode is electrically connected to the second driving chip 315.

The first type via includes a source via 308, a drain via 310 and a gate via 309; the first type signal electrode includes: a source signal electrode, connected to the source through the source via 308 for receiving a source signal; a drain signal electrode, connected to the drain through the drain via 310 for receiving a drain signal; a gate signal electrode, connected to the gate through the gate via 309 for receiving a gate signal.

The second type via includes an anode via 311, and the second type signal electrode includes an anode signal electrode, and the anode signal electrode is connected to an anode layer of the pixel unit layer 304 through the anode via 311 for receiving an anode signal.

The third type via includes a driving electrode via 312 and a sensing electrode via 313, and the third type signal electrode includes: a driving signal electrode, connected to the driving electrode of the touch layer 305 through the driving electrode via 312 for receiving a driving electrode signal; and a sensing signal electrode, connected to the sensing electrode of the touch layer 305 through the sensing electrode via 313 for receiving a sensing electrode signal.

Compared to existing OLED devices, the OLED device and the manufacturing method thereof of the present disclosure introduce signals of the thin film transistor layer, the pixel unit layer and the touch layer onto an independent signal layer by using a via method, and after bonding the first driving chip (DIC), the flexible circuit board (FPC) can be directly disposed under the display panel without bending to eliminate a black border caused by COF/COP and effectively increase the display area. Meanwhile, by adding a protective buffer layer under the first driving chip and the second driving chip (TIC), the FPC of the first driving chip and the second driving chip is integrated, thereby increasing the integration degree of the display panel; the first driving chip/second driving chip is protected by the high-viscosity opaque adhesive, which can reduce the fragility and enhance the mechanical strength; since pins of the first driving chip/the second driving chip are protected by a high viscosity opaque adhesive, it is difficult to analyze optical, electrical and other properties by conventional means, such as a light mirror, an oscilloscope, a multimeter, etc., and enhance the data confidentiality thereof.

In summary, although the above preferred embodiments of the present disclosure are disclosed, the foregoing preferred embodiments are not intended to limit the disclosure, those skilled in the art can make various kinds of alterations and modifications without departing from the spirit and scope of the present disclosure. Thus, the scope of protection of the present disclosure is defined by the scope of the claims.

What is claimed is:

1. A manufacturing method of an organic light emitting diode device, comprising a display panel, wherein the manufacturing method comprises steps of:

Step S1, cleaning a glass substrate, and providing a metal film on the glass substrate, and etching the metal film to form signal electrodes spaced apart, wherein the signal electrodes comprise a first type signal electrode and a second type signal electrode;

Step S2, sequentially preparing a flexible substrate and a thin film transistor layer on the glass substrate, the thin film transistor layer comprising a plurality of signal traces connected to the first type signal electrode through at least one first type via;

Step S3, preparing a pixel unit layer on the thin film transistor layer, the pixel unit layer comprising a plurality of signal traces connected to the second type signal electrode through at least one second type via;

Step S4, stripping the glass substrate, and bonding a first driving chip to a surface of the flexible substrate stripped from the glass substrate, wherein both the first type signal electrode and the second type signal electrode are electrically connected to the first driving chip; and Step S5, preparing a flexible circuit board on the surface of the flexible substrate close to the signal electrodes, and bonding the flexible circuit board to the first driving chip.

2. The manufacturing method according to claim 1, wherein the at least one first type via comprises a source via, a drain via, and a gate via; the first type signal electrode comprises:

a source signal electrode, connected to a source of the thin film transistor layer through the source via for receiving a source signal;

a drain signal electrode, connected to a drain of the thin film transistor layer through the drain via for receiving a drain signal;

a gate signal electrode, connected to a gate of the thin film transistor layer through the gate via for receiving a gate signal;

wherein the at least one second type via comprises an anode via, and the second type signal electrode comprises an anode signal electrode, and the anode signal electrode is connected to an anode layer of the pixel unit layer through the anode via for receiving an anode signal.

3. The manufacturing method according to claim 1, wherein the organic light emitting diode device further comprises a touch screen, and the signal electrodes further comprise a third type signal electrode, and after Step S3, the manufacturing method further comprises a step of:

Step S31, preparing a touch layer on the pixel unit layer, and a signal trace of the touch layer is connected to the third type signal electrode through at least one third type via;

wherein the at least one third type via comprises a driving electrode via and a sensing electrode via, and the third type signal electrode comprises: a driving signal electrode, connected to the driving electrode of the touch layer through the driving electrode via for receiving a driving electrode signal; and a sensing signal electrode, connected to the sensing electrode of the touch layer through the sensing electrode via for receiving a sensing electrode signal.

4. The manufacturing method according to claim 3, wherein after Step S4, the manufacturing method further comprises a step of:

Step S41, bonding a second driving chip to the surface of the flexible substrate, wherein the second driving chip is spaced apart from the first driving chip and is arranged in a same surface with the first driving chip, wherein the driving signal electrode and the sensing signal electrode are electrically connected to the second driving chip, respectively;

wherein after Step S5, the manufacturing method further comprises a step of:

Step S51, connecting the second driving chip to the flexible circuit board, such that the flexible circuit board is located at a rear portion of the display panel of the organic light emitting diode device.

5. The manufacturing method according to claim 4, further comprising steps of:

Step S6, performing a lighting test on the organic light emitting diode device;

Step S7, preparing a thin film encapsulation layer on a surface of the touch layer after the organic light emitting diode device is normally displaying;

Step S8, inverting the organic light emitting diode device, and coating a surface of the flexible substrate with a high-viscosity opaque protective adhesive for planarization, wherein the protective adhesive covers the first driving chip, the second driving chip and a portion of the flexible circuit board; and Step S9, sequentially attaching a polarizer and a protective cover to one side of the thin film encapsulation layer of the organic light emitting diode device.

6. An organic light emitting diode device, comprising:

a flexible substrate;

a thin film transistor layer, disposed on the flexible substrate;

a pixel unit layer, disposed on the thin film transistor layer; and signal electrodes, embedded in a surface of one side of the flexible substrate away from the pixel unit layer, wherein the signal electrodes comprise a first type signal electrode and a second type signal electrode;

a first driving chip, disposed on the surface of the one side of the flexible substrate away from the pixel unit layer;

a flexible circuit board, disposed on the one side of the flexible substrate away from the pixel unit layer, and bonded to the first driving chip;

wherein a signal trace of the thin film transistor layer is connected to the first type signal electrode through at least one first type via, and a signal trace of the pixel unit layer is connected to the second type signal electrode through at least one second type via, and both the first type signal electrode and the second type signal electrode are electrically connected to the first driving chip.

7. The organic light emitting diode device according to claim 6, wherein the at least one first type via comprises a source via, a drain via, and a gate via;

the first type signal electrode comprises:

a source signal electrode, connected to a source of the thin film transistor layer through the source via for receiving a source signal;

a drain signal electrode, connected to a drain of the thin film transistor layer through the drain via for receiving a drain signal;

a gate signal electrode, connected to a gate of the thin film transistor layer through the gate via for receiving a gate signal;

wherein the at least one second type via comprises an anode via, and the second type signal electrode comprises an anode signal electrode, and the anode signal electrode is connected to an anode layer of the pixel unit layer through the anode via for receiving an anode signal.

8. The organic light emitting diode device according to claim 6, further comprising:

a touch layer, disposed on the pixel unit layer; and a second driving chip, disposed on the surface of the one side of the flexible substrate away from the pixel unit layer, and spaced apart from the first driving chip and arranged in a same layer with the first driving chip, wherein the second driving chip and the first driving chip are arranged on and are electrically connected to and sharing the flexible circuit board with the first driving chip;

wherein the signal electrodes further comprise a third type signal electrode, and a signal trace of the touch layer is connected to the third type signal electrode through at least one third type via, and the third type signal electrode is electrically connected to the second driving chip;

wherein the at least one third type via comprises a driving electrode via and a sensing electrode via, and the third type signal electrode comprises: a driving signal electrode, connected to the driving electrode of the touch layer through the driving electrode via for receiving a driving electrode signal; and a sensing signal electrode, connected to the sensing electrode of the touch layer through the sensing electrode via for receiving a sensing electrode signal.

9. The organic light emitting diode device according to claim 8, wherein surfaces of the first driving chip, the second driving chip and a portion of the flexible circuit board are formed with a high-viscosity opaque protective adhesive.

10. The organic light emitting diode device according to claim 8, further comprising:

a thin film encapsulation layer, disposed on the touch layer;

a polarizer, disposed on the thin film encapsulation layer; and a protective cover, disposed on the polarizer.

\* \* \* \* \*